United States Patent
Yatsuo et al.

(10) Patent No.: US 6,750,477 B2
(45) Date of Patent: Jun. 15, 2004

(54) STATIC INDUCTION TRANSISTOR

(75) Inventors: Tsutomu Yatsuo, Hitachi (JP); Toshiyuki Ohno, Hitachi (JP); Hidekatsu Onose, Hitachi (JP); Saburo Oikawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 153 days.

(21) Appl. No.: 10/121,623

(22) Filed: Apr. 15, 2002

(65) Prior Publication Data

US 2002/0109145 A1 Aug. 15, 2002

Related U.S. Application Data

(63) Continuation of application No. 09/806,319, filed as application No. PCT/JP99/05278 on Sep. 28, 1999.

(30) Foreign Application Priority Data

Sep. 30, 1998 (JP) .......................... 10-276954

(51) Int. Cl.$^7$ ........................................ H01L 31/0312
(52) U.S. Cl. ..................... 257/77; 257/37; 257/132; 257/136; 257/154; 257/162; 257/264; 257/266; 438/40
(58) Field of Search ...................... 257/37, 132, 136, 257/154; 438/40

(56) References Cited

U.S. PATENT DOCUMENTS

| | | | | |
|---|---|---|---|---|
| 5,143,859 A | * | 9/1992 | Harada | 438/137 |
| 5,323,029 A | * | 6/1994 | Nishizawa | 257/136 |
| 5,663,582 A | | 9/1997 | Nishizawa et al. | |
| 5,736,753 A | | 4/1998 | Ohno et al. | |
| 5,903,020 A | * | 5/1999 | Siergiej et al. | 257/264 |

FOREIGN PATENT DOCUMENTS

| | | |
|---|---|---|
| JP | 5-218452 | 8/1993 |
| JP | 7-131016 | 5/1995 |
| JP | 8-316494 | 11/1996 |

OTHER PUBLICATIONS

Shenoy et al, J., "High–Voltage Double–Implanted Power MOSFET's in 6H–SiC", (IEEE Electron Devices Letters, vol. 18, No. 3, pp. 93–95), Mar. 1997.
Nishizawa et al, J., "Field–Effect Transistor Versus Analog Transistor (Static Reduction Transistor)", (IEEE Trans. on Electron Devices, vol. ED–22, pp. 185–197) No. 4, Apr. 1975.
Iwasaki et al, T., "Electrical Characteristics of A Novel Gate Structure 4H–SiC Power Static Induction Transistor", (International Conference on Silicon Carbide, –nitorides and Related Materials, pp. 443–444), 1997 [ABSTRACT only].
Iwasaki et al, T., "Electrical Characteristics of A Novel Gate Structure 4H–SiC Power Static Induction Transistor", (Materials Science Forum, vols. 264–268, pp. 1085–1088). 1998 Trans Tech Publications, Switzerland [complete article].

* cited by examiner

Primary Examiner—Hoai Ho
Assistant Examiner—Mai-Huong Tran
(74) Attorney, Agent, or Firm—Antonelli, Terry, Stout & Kraus, LLP

(57) ABSTRACT

In a static induction transistor, in addition to a first gate layer (4), a plurality of second gate layers (41) having a shallower depth and a narrower gap therebetween than those of the first gate layer (4) are provided in an area surrounded by the first gate layer (4), thereby an SiC static induction transistor with an excellent off characteristic is realized, while ensuring a required processing accuracy during production thereof.

20 Claims, 5 Drawing Sheets

STATIC INDUCTION TRANSISTOR

This application is a continuation of U.S. application Ser. No. 09/806,319, filed Mar. 29, 2001, which is a Section 371 of International Application PCT/JP99/05278, filed Sep. 28, 1999, and the entire disclosures of which are hereby incorporated by reference.

BACKGROUND OF THE INVENTION

1. Field of the Invention

The present invention relates to an improvement in the structure of a static induction transistor.

2. Conventional Art

In association with a demand for increasing electric power and for a high frequency operation for a power inverter, semiconductor switching elements with a low loss and a high speed operation as well as with a large controllable current are desired.

To meet with these demands, a switching element using silicon carbide (SiC) as its base material is proposed. For example, a power MOSFET as disclosed In "High-Voltage Double-Implanted Power MOSFETs in 6H-SiC" (IEEE Electron Devices Letters, Vol. 18, NO.3, p.93–95(1997)) is investigated. However. in the power MOSFET in which an inversion layer having a low carrier mobility is used for a channel layer serving as a current passage, there arises a problem of increasing its on voltage.

Another static induction transistor is promising which does not use such inversion layer as a channel layer in order to avoid such problem as disclosed, for example in "Field-effect Transistor Versus Analog Transistor (State Induction Transistor)" (IEEE Trans. on Electron Devices, Vol. ED-22, p.185–197, 1975).

FIG. 2 shows a perspective cross sectional view of a conventional static induction transistor. A semiconductor substrate 1 of the static induction transistor is constituted by an $n^+$ conductivity type region 2, an $n^+$ conductivity type region 3, a $p^+$ conductivity type region 4 and $n^+$ conductivity type source layer 5, and is provided with a source electrode 6, a drain electrode 7 and a gate electrode 8. Through reducing the potential of the gate electrode 8 with respect to the source electrode 6, a depletion layer is spread between the $p^+$ conductivity type layers 4, namely, in a so-called channel region, thereby a current flowing between the drain electrode 7 and the source electrode 6 can be turned off. For example, in a published abstract entitled, "Electrical Characteristics of A Novel Gate Structure 4H-SiC Power Static Induction Transistor" (International Conference on Silicon Carbide, III—nitrides and Related Materials-1997, Abstract p.443, (1997)), there was reported a possibility of realizing an extremely low on resistance through use of an SiC base material for the channel region.

However, with the base structure as shown in FIG. 2, there arises a problem that its off characteristic is extremely undesirable because of a production process limitation inherent to SiC, which will be explained below. Namely, in the above conventional static Induction transistor, it is necessary to narrow the gap between the $p^+$ conductivity type layers 4 to such an extent that the respective depletion layers thereof overlap each other, when a gate voltage is applied thereto during off period thereof, as well as the $p^+$ conductivity type layers 4 have to be formed as deep as possible and in a high density layers so as to hold an off ability with a comparatively low gate voltage for a high reverse voltage of hundreds to thousands volt However, the junction of SiC is designed to make use of its inherent material characteristic that the dielectric breakdown electric field of its junction is about ten times larger than that of Si, the impurity density of the $n^+$ conductivity type layer 3 is usually set in a high density of 70–100 times in comparison with the use of Si. Therefore, the expansion of the depletion layers is extremely limited. For this reason it is necessary that the gap between the $p^+$ conductivity type layers 4 has to set at an extremely narrow amount such as about 1 $\mu$m or less than 1 $\mu$m in order to obtain a pinch off effect due to the depletion layer. Further, a deep p conductivity type layer is formed for Si through a thermal diffusion of acceptor impurities such as boron and aluminum. However, since the diffusion coefficients of these impurities are extremely low for SiC, the thermal diffusion method can not be used for SiC and the deep p conductivity type layer has to be directly formed only by an ion implantation method. However, it is quite difficult to selectively form a deep implantation layer of about 1 $\mu$m with narrow gaps only through an ion implantation. This is because it is quite difficult to produce an implantation mask with a large film thickness and a narrow gap. For example, when using a photo resist which is commonly and usually used as an implantation mask, an implantation energy of about 500 keV is required for implanting boron in a depth of 1 $\mu$m, and the mask thickness of more than 4 $\mu$m is necessary for enduring the implantation energy. It is very hard to process the width and gap in such a thick photo resist in a range of less than 1 $\mu$m with a high accuracy. Accordingly, with the static induction transistor (hereinafter, abbreviated as SIT) using SiC and with the base structure as shown in FIG. 2, a characteristic with a large gate off gain can not be expected. Moreover, a realization of an SIT with a normally off function is almost impossible.

As has been explained above, when applying the conventional measures used in connection with Si in manufacture of a static induction transistor using SiC as its base material, a necessary channel width is about 1 $\mu$m for obtaining a comparatively high off gain. Therefore, the formation of a deep p conductivity type gate layer with a high impurity density through an ion implantation method is quite difficult due to the limitation of the implantation mask processing accuracy. Further, since the source layer has to be formed in such a narrow gap, an extremely high accuracy is required for their pattern matching. As a result, a production of an SIT having an excellent off characteristic including normally off function is difficult.

SUMMARY OF THE INVENTION

An object of the present invention is to provide a static induction transistor with a new structure which resolves the above mentioned problems.

Another object of the present invention is to provide a static induction transistor with a new structure which shows an excellent off characteristic.

Still another object of the present invention is to provide a static induction transistor with a new structure which permits a production thereof with a high yield.

In order to achieve the above objects, a gate region of the static induction transistor according to the present invention is structured in such a manner to provide a first gate layer and a plurality of second gate layers which are surrounded by the first gate layer and of which depth, width and gap are smaller than those of the first gate layer.

With the above measure, when the static induction transistor moves from an on state to an off state, the following occurs. At first an electron flow from a source layer is prevented with a low gate voltage due to a pinch off effect in other words there is overlapping of depletion layers of the second gate layers having a narrow width. Thereafter, an increasing drain voltage is prevented up to a high voltage with a further high gate voltage due to a pinch off effect, in other words, there is overlapping of depletion layers of the first gate layer having a wide width, and thereby an SIT with an excellent off characteristic is realized. Herein, when the gap between the second gate layers is extremely narrowed, an SIT having a normally off function can be realized which exerts a pinch off effect under a short circuited or an open circuited condition between a gate electrode and a source electrode.

Further, according to the present invention, when forming the second gate layers with a narrow width through an ion implantation, an extremely thin implantation mask can be applied depending on a decrease of the implantation energy and an implantation mask permitting a high processing accuracy is obtained. As a result, an SIT with a high off gain can be produced with a high yield.

DETAILED DESCRIPTION OF THE EMBODIMENTS

Figure 1:
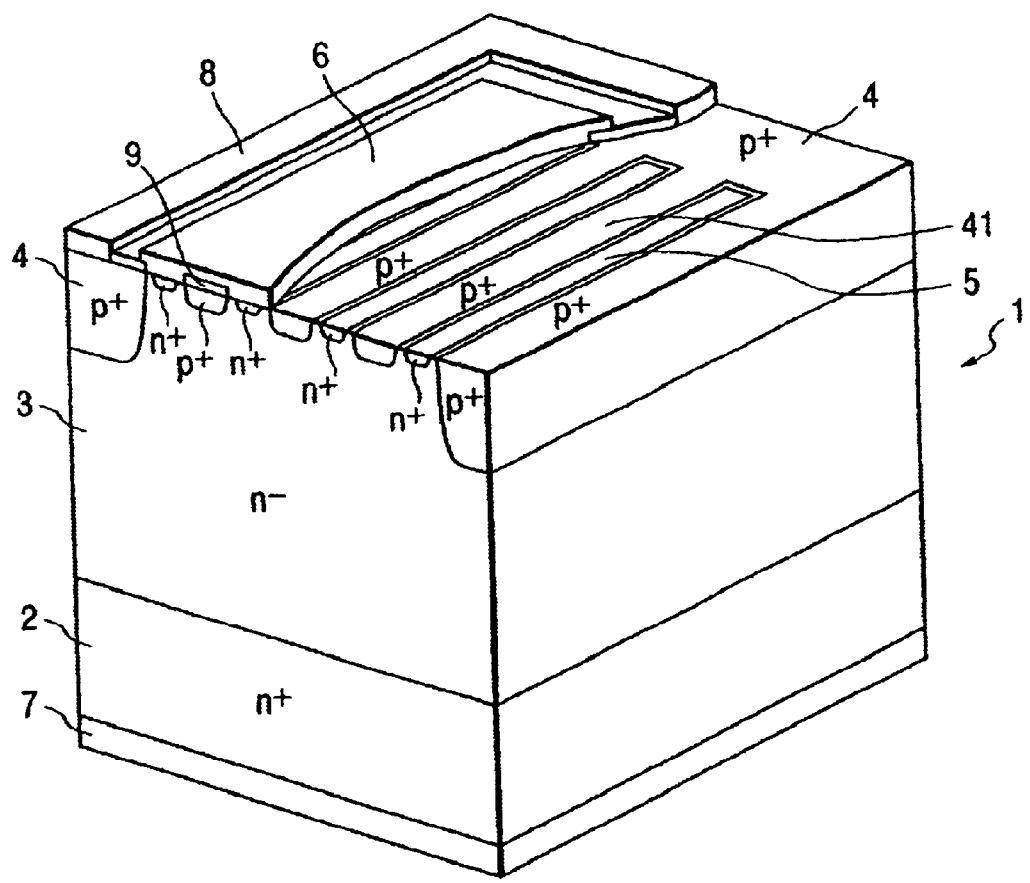
FIG. 1 is a perspective cross sectional view showing a first embodiment of the SiC static induction transistor according to the present invention.

Hereinbelow, the present invention is explained in detail with reference to the embodiments as shown in the drawings.

FIG. 1 is a perspective cross sectional view of a base unit call of a static induction transistor representing the first embodiment according to the present invention. An SiC semiconductor base body 1 in a shape of parallel flat plate having upper and lower major faces is constituted by a low resistance n⁻ conductivity type layer 2 having an impurity density of about $3\times10^{19} cm^{-3}$ and a thickness of about 300 $\mu m$, and a high resistance n conductivity type layer 3 having an impurity density of about $1\times10^{16} cm^{-3}$ lower than that of the n⁺ conductivity type layer 2 and a thickness of about 12 $\mu m$. On one of the major faces of the n⁻ conductivity type layer 3 is exposed a p⁺ conductivity type first gate layer 4, of which depth, width and boron implantation amount are respectively about 1 $\mu m$, about 1 $\mu m$ and about $1\times10^{15}/cm^2$ and having a higher impurity density than that of the n⁻ conductivity type layer 3, is provided along the circumference of the cell. Further, near the one major surface area having a width of about 2 $\mu m$ surrounded by the first gate layer 4, a plurality of stripe shaped p⁺ conductivity type second gate layers 41, of which depth, width and boron implantation amount are respectively about 0.15 $\mu m$, about 0.2 $\mu m$ and about $1\times10^{14}/cm^2$ and having a higher impurity density than that of the n⁻ conductivity type layer 3 are provided with a gap of about 0.2 $\mu m$, and the second gate layers 41 are contacted to the first gate layer 4 at the edge portion of the cell. The gap between adjacent second gate layers 41 is narrower than that between the first gate layers 4. Further, the depth of the second gate layers 41 from the major surface of the semiconductor base body 1 is shallower than that of the first gate layer 4. Between adjacent two second gate layers 41, the n conductivity type layer 3 having a width of about 0.2 $\mu m$ is disposed. On the one major surface area surrounded by the second gate layers 41 and having a width of about 0.2 $\mu m$, the n⁺ conductivity type source layer 5 of which depth and nitrogen implantation amount are respectively about 0.05 $\mu m$ and $1\times10^{15}/cm^2$ and having a higher impurity density than that of the n⁻ conductivity type layer 3.

Figure 2:
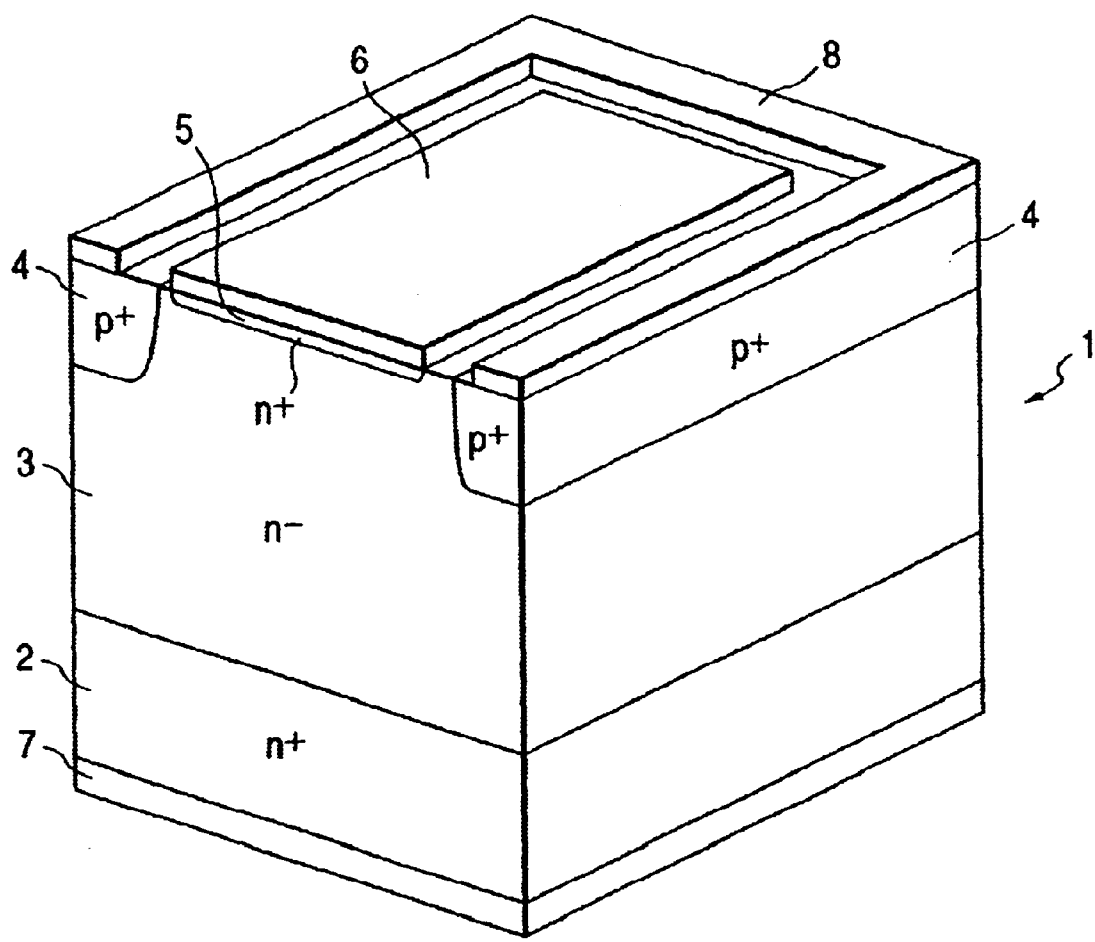
FIG. 2 is a perspective cross sectional view showing a conventional static induction transistor.

Further, on the one major surface of the semiconductor base body 1 a source electrode 6 and a gate electrode 8, and on the other major surface thereof a drain electrode 7 are respectively, provided. In order to prevent an electrical contact between the source electrode 6 and the respective gate layers 4 and 41 an insulating film 9 is interposed therebetween. A difference of the present embodiment from the conventional example, as shown in FIG. 2, is the provision of the narrow width second gate layers 41.

Operations of the respective portions of the above will be explained. A turning off of a current between the source and drain is caused by applying a negative potential to the gate electrode 8 with respect to the source electrode 6. Since the gap between the second gate layers 41 is set at about 0.2 $\mu m$, which is far narrower than that between the first gate layers 4, an overlapping of depletion layers is caused with a lower gate voltage of a few to a few tens volt so as to prevent an electron flow from the source layer 5. Due to prevention of the electron flow from the source layer 5, an internal impedance between the source and drain suddenly increases and, thereby, the drain voltage jumps up to a power source voltage. The high voltage can not be prevented solely by the shallow second gate layers 41. Through application of a gate voltage corresponding to the voltage to be prevented, an overlapping of depletion layers expanding from the first gate layers 4 having a deep junction and being disposed with a comparatively wide width is caused, and thereby the semiconductor element holds a high voltage off state due to a pinch off effect induced by the depletion layer overlapping. In this high voltage preventing operation, the quick suppression of the electron injection from the source layer 5 due to the pinch off effect of the second gate layers 41 makes easy the overlapping of the depletion layers from the first layers. As a result, even for a turning off from a high current density state a turning off operation with a high gain is enabled.

Figure 3:
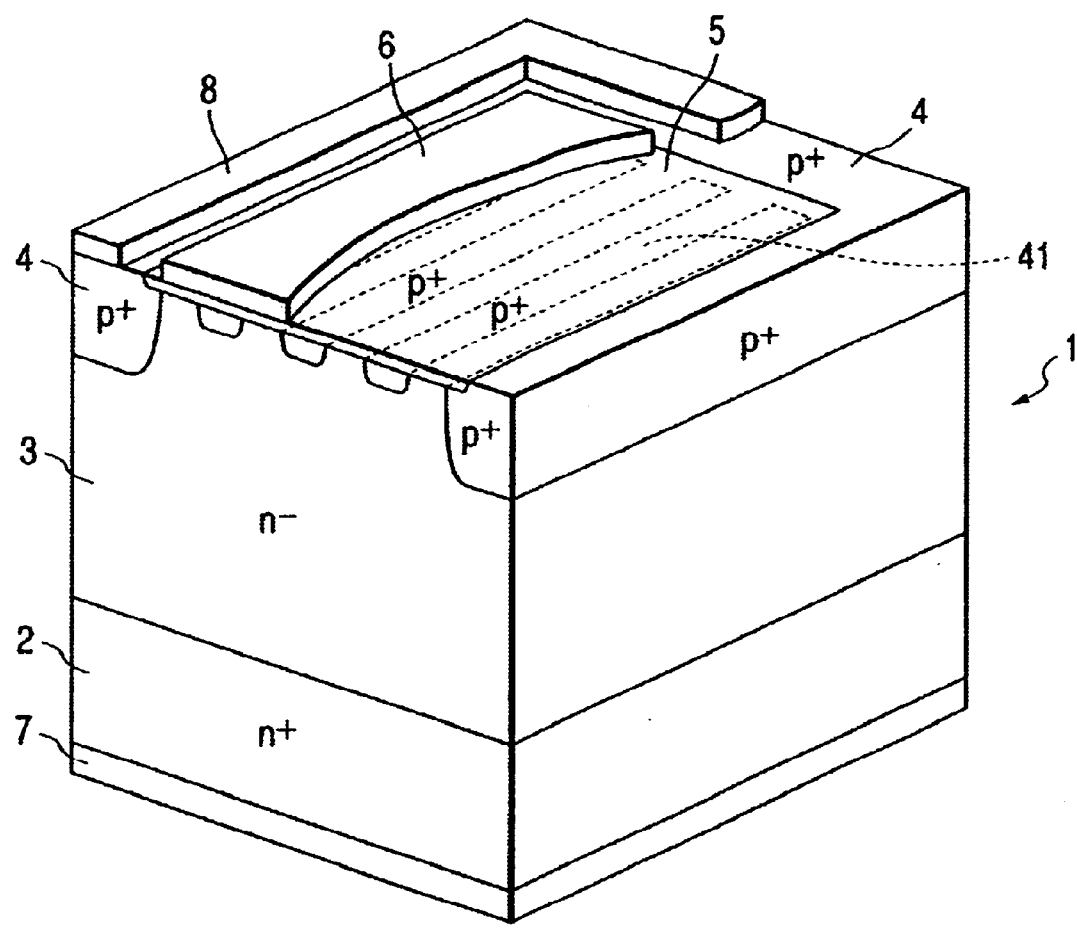
FIG. 3 is a perspective cross sectional view showing a second embodiment of the SiC static induction transistor according to the present invention.

FIG. 3 is a perspective cross sectional view of a base unit cell of a static induction transistor representing the second embodiment according to the present invention. In the present embodiment, the portions bearing the same reference numerals as those in the first embodiment designate the same structures, conductivity type or the functions as those explained in connection with the first embodiment. A difference of the present embodiment from the embodiment as shown in FIG. 1 is that a source layer 5 overlaps the respective gate layers 4 and 41 and is contacted thereto. Since the source layer 5 overlaps and is contacted to the respective gate layers 4 and 41, an advantage thereof is that a requirement for alignment accuracy can be reduced which significantly simplifies the production process.

An SIT of a high prevention voltage is required to have a gate source junction having a possibly high withstanding voltage. However, since the maximum electric field breakdown strength of a pn junction formed in SiC monocrystalline is ten times higher than that formed in SiC, the SIT using an SiC monocrystalline as the base material makes use of such characteristic that even with a junction constituted by a high impurity density p and n layers a sufficiently high withstanding voltage can be obtained. Therefore, with the present embodiment, a gate junction withstanding voltage of a few tens to a few hundreds volt is obtained.

Figure 4A:
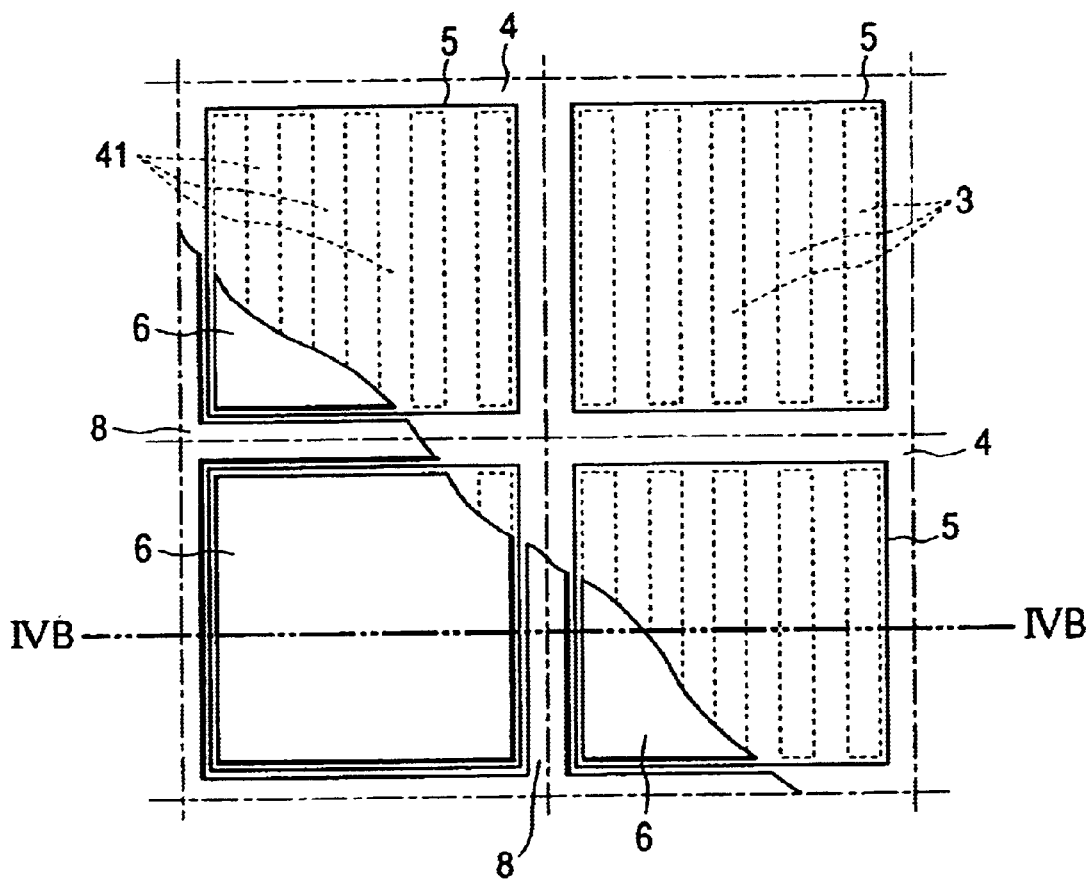
FIG. 4A is a plane view of a layout of base cells of the SiC static induction transistor one of which is shown in FIG. 3.
Figure 4B:
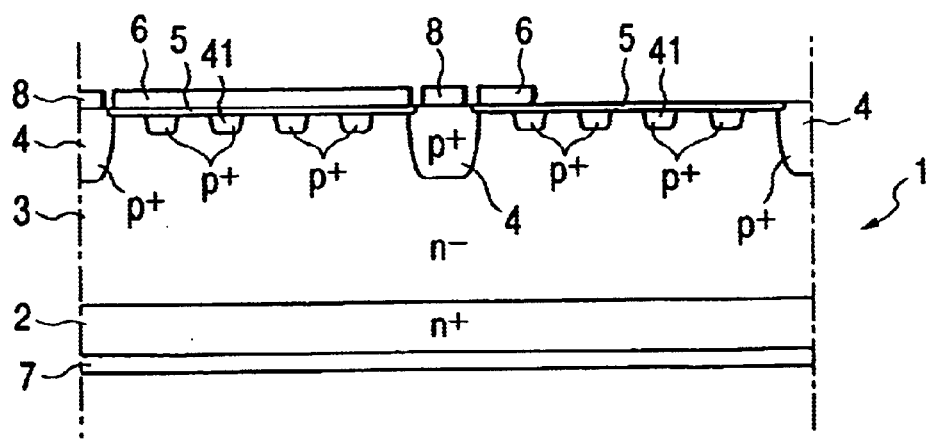
FIG. 4B is a cross sectional view taken along a line IVB—IVB in FIG. 4A.

FIG. 4A shows a layout example of the unit cell as shown in the second embodiment according to the present invention, and FIG. 4B is a cross sectional view taken along the line IVB—IVB in FIG. 4A. The portions in FIGS. 4A and 4B bearing the same reference numerals as those in the second embodiment, as shown in FIG. 3, designate the same structures, conductivity type or the functions as those explained in connection with the second embodiment. The portion surrounded by a dashed line corresponds to a unit cell of the second embodiment as shown in FIG. 3, and in FIG. 4A a layout of total four unit cells is illustrated. Number of unit cells arranged together increases depending on a current capacity of the element concerned.

In the present example, the gate electrode 8 is provided on all of the surface of the first gate layers 4 on respective cells, however, the gate electrode 8 is not necessarily provided for all of the cells and can be provided partly to the extent that an electric resistance thereof permits. Further, when an insulating material is interposed between the source electrode 6 and the gate electrode 8, the source electrode 6 can be structured so as to cover most of the surface of the semiconductor chip.

Figure 5A:
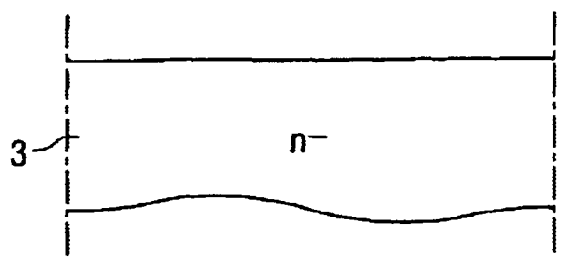
FIGS. 5A through 5E are views for explaining production process of the SiC static induction transistor as shown in FIG. 3.
Figure 5B:
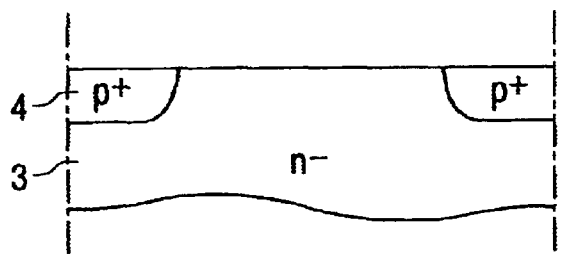
Figure 5C:
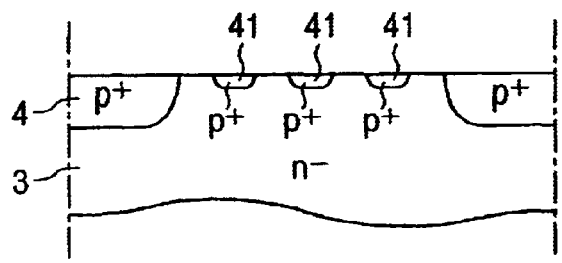
Figure 5D:
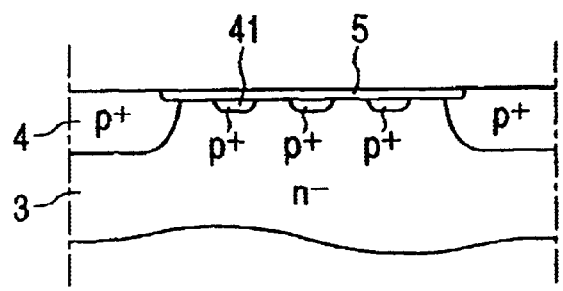
Figure 5E:
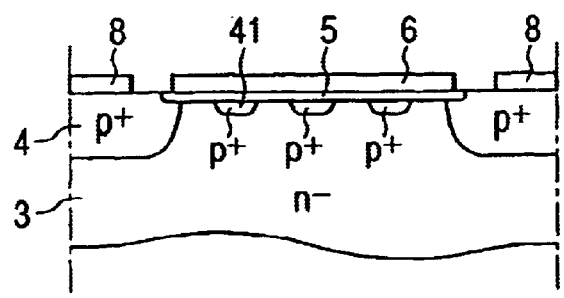

FIGS. 5A through 5E are views showing major processes for producing the second embodiment according to the present invention. The portions in FIGS. 5A through 5E bearing the same reference numerals as those in the second embodiment as shown in FIG. 3 designate the same structures, conductivity type or the functions as those explained in connection with the second embodiment. FIG. 5A shows a cross sectional view of the n conductivity type layer 3 at the one major surface of the semiconductor base body 1 and with the no conductivity type layer 2 at the lower portion thereof omitted for this showing. In FIG. 5B, the $p^+$ conductivity type gate layer 4 is formed in the part of the n conductivity type layer 3 through selective boron ion implantation from the surface of the n conductivity type layer 3. The implantation amount was about $1\times10^{15}/cm^2$, and the implantation energy was varied in three steps, namely, at 500 keV, 300keV and 50 keV. At this instance, a photo resist film having a thickness of about 4.0 $\mu$m was used as the implantation mask. Subsequently, in FIG. 5C, boron ions were implanted with an implantation amount of about $1\times10^{14}/cm^2$ and with an implantation energy of about 50 keV, while using a photo resist film having a thickness of about 0.3 $\mu$m as the implantation mask. Thereafter, in FIG. 5D, nitrogen ions were implanted with an implantation amount of about $1\times10^{14}/cm^2$ and with an implantation energy of about 30 keV, while using a photo resist film having a thickness of about 0.3 $\mu$m as the implantation mask. After the ion implantation, the semiconductor base body 1 was subjected to an activation treatment by annealing the same at a temperature of about 1500° C. In FIG. 5E, metals of Ti/Al and Ni were respectively deposited on the surfaces of the first gate layers 4 and the source layer 5 to complete the function regions of the device.

In the above embodiments, a semiconductor base body 1 of n conductivity type is exemplified, however, the present invention is applicable, also, to a semiconductor base body of p conductivity type. In such a case all conductivity types as shown in the embodiments are reversed, accordingly.

According to the present invention, an SiC static induction transistor with an excellent off characteristic can be realized while eliminating a processing difficulty.

What is claimed is:

1. A static induction transistor comprising:
   a silicon carbide (SiC) semiconductor base body (1) having a first conductivity type;
   a first gate layer of a second conductivity type formed on a first major surface of said SiC semiconductor base body;
   a source layer of said first conductivity type formed on said first major surface of said SiC semiconductor base body;
   a source electrode being contacted to said source layer;
   a gate electrode being contacted to said first gate layer;
   a drain electrode being contacted to an opposing, second major surface of said SiC semiconductor base body; and
   a plurality of second gate layers of said second conductivity type disposed of said first major surface in a region surrounded by said first gate layer,
   wherein each of said second gate layers has a width and a depth which are smaller than that of said first gate layer.

2. A static induction transfer according to claim 1,
   wherein said source layer is formed to overlap an outer surface of said plurality of second gate layers and is contacted to both said first gate layer and said plurality of second gate layers, respectively.

3. A static induction transfer according to claim 2,
   wherein gap spacings between adjacent ones of said second gate layers are set in such a manner that depletion layers expanding from the respective adjacent gate layers overlap each other under a short circuited or an open circuited state between said gate electrode and said source electrode.

4. A static induction transistor according to claim 3,
   wherein said plurality of second gate layers are stripe shaped and are arranged in parallel with a uniform gap spacing therebetween.

5. A static induction transistor according to claim 1,
   wherein said source layer is formed to overlap an outer surface of said plurality of second gate layers and a part of said first gate layer, and is contacted to both said first gate layer and said plurality of second gate layers, respectively.

6. A static induction transistor according to claim 5,
   wherein gap spacings between adjacent ones of said second gate layers are set in such a manner that depletion layers expanding from the respective adjacent gate layers overlap each other under a short circuited or an open circuited state between said gate electrode and said source electrode.

7. A static induction transistor according to claim 6,
   wherein said plurality of second gate layers are stripe shaped and are arranged in parallel with a uniform gap spacing therebetween.

8. A static induction transistor according to claim 1,
   wherein gap spacings between adjacent ones of said second gate layers are set in such a manner that depletion layers expanding from the respective adjacent gate layers overlap each other under a short circuited or an open circuited state between said gate electrode and said source electrode.

9. A static induction transistor according to claim 8, wherein said plurality of second gate layers are stripe shaped and are arranged in parallel with a uniform gap spacing therebetween.

10. A static induction transistor according to claim 9, wherein said first gate layer and each of said second gate layers are heavily doped second conductivity type layers formed in a lightly doped first conductivity type region of said semiconductor base body.

11. A static induction transistor according to claim 9, wherein said first and second gate layers are heavily doped p type layers and said source layer is a heavily doped n type layer, which are formed in a lightly doped n conductivity region.

12. A static induction transistor according to claim 9, wherein said first and second gate layers are heavily doped n type layers and said source layer is a heavily doped p type layer, which are formed in a lightly doped p conductivity region.

13. A static induction transistor according to claim 1, wherein said first and second gate layers are heavily doped p type layers and said source layer is a heavily doped n type layer, which are formed in a lightly doped n conductivity region.

14. A static induction transistor according to claim 1, wherein said first and second gate layers are heavily doped n type layers and said source layer is a heavily doped p type layer, which are formed in a lightly doped p conductivity region.

15. A static induction transistor according to claim 1, wherein said source layer is constituted by a plurality of heavily doped stripe shaped regions of said first conductivity type each of which has a smaller depth and width than that of said second gate layers.

16. A static induction transistor according to claim 15, wherein said stripe shaped regions of said source layer are respectively disposed in gap spacings seperating said second gate layers and that seperating second gate layers and said first gate layer.

17. A static induction transistor according to claim 16, wherein first and second conductivity types are an n type and a p type conductivity, respectively.

18. A static induction transistor according to claim 17, wherein first and second conductivity types are an n type and a p type conductivity, respectively.

19. A static induction transistor according to claim 16, wherein said source electrode is electrically isolated from said first and said plural second gate electrodes, respectively, is an insulating film extending over the first major surface in a manner to cover each of said second gate layers and a part of said first gate layer which is not contacted to said gate electrode.

20. A static induction transistor according to claim 19, wherein said first conductivity type is one of a p and n type conductivity and said second conductivity type is the other of said p and n type conductivity.

* * * * *